(12) United States Patent
Colbeck

(10) Patent No.: US 9,742,309 B2
(45) Date of Patent: Aug. 22, 2017

(54) WAVEFORM SHAPE DISCRIMINATOR

(71) Applicant: Power Integrations, Inc., San Jose, CA (US)

(72) Inventor: Roger Colbeck, Ottawa (CA)

(73) Assignee: Power Integrations, Inc., San Jose, CA (US)

(*) Notice: Subject to any disclaimer, the term of this patent is extended or adjusted under 35 U.S.C. 154(b) by 165 days.

(21) Appl. No.: 14/025,453

(22) Filed: Sep. 12, 2013

(65) Prior Publication Data

US 2015/0070953 A1 Mar. 12, 2015

(51) Int. Cl.
| | |
|---|---|
| *H02M 3/155* | (2006.01) |
| *H02M 7/217* | (2006.01) |
| *G01R 19/30* | (2006.01) |
| *H02M 1/42* | (2007.01) |
| *H02M 3/156* | (2006.01) |
| *G01R 19/165* | (2006.01) |
| *G01R 19/25* | (2006.01) |
| *H02M 1/00* | (2006.01) |

(52) U.S. Cl.
CPC ............ *H02M 7/217* (2013.01); *G01R 19/30* (2013.01); *H02M 1/4225* (2013.01); *G01R 19/16538* (2013.01); *G01R 19/2506* (2013.01); *H02M 3/155* (2013.01); *H02M 3/156* (2013.01); *H02M 2001/0022* (2013.01); *Y02B 70/126* (2013.01)

(58) Field of Classification Search
CPC ........ H02M 1/08; H02M 1/42; H02M 1/4208; H02M 1/12; H02M 3/156; H02M 3/155; H02M 3/145; H02M 3/158; H02M 3/1588; H02M 2003/1552
USPC ................... 323/205, 207, 222, 280–285
See application file for complete search history.

(56) References Cited

U.S. PATENT DOCUMENTS

| | | | |
|---|---|---|---|
| 7,723,964 B2* | 5/2010 | Taguchi | 323/222 |
| 2009/0141523 A1* | 6/2009 | Sugawara | 363/89 |
| 2010/0067270 A1* | 3/2010 | Odell | 363/89 |
| 2010/0118573 A1* | 5/2010 | Saint-Pierre | 363/126 |

* cited by examiner

*Primary Examiner* — Timothy J Dole
*Assistant Examiner* — Bryan R Perez
(74) *Attorney, Agent, or Firm* — Christensen O'Connor Johnson Kindness PLLC

(57) ABSTRACT

A waveform shape discriminator includes a running maximum finder circuit coupled to receive a sense signal. The running maximum finder circuit is coupled to update a running maximum signal in response to the sense signal. A first comparator is coupled to receive the sense signal and a running maximum threshold signal that is representative of the running maximum signal. A search window block is coupled to receive the input signal to detect a search window in the sense signal. An output circuit is coupled to an output of the first comparator and an output of the search window block to determine a presence of a waveform shape in the sense signal within the search window in the sense signal.

30 Claims, 8 Drawing Sheets

WAVEFORM SHAPE DISCRIMINATOR

BACKGROUND INFORMATION

Field of the Disclosure

The present invention relates generally to input signal detecting circuits, and more specifically to circuits for detecting the shape of the input signal.

Background

Electronic devices use power to operate. Switched mode power converters are commonly used due to their high efficiency, small size and low weight to power many of today's electronics. Conventional wall sockets provide a high voltage alternating current. In a switching power converter a high voltage alternating current (ac) input is converted to provide a well-regulated direct current (dc) output through an energy transfer element to a load. In operation, a switch is utilized to provide the desired output by varying the duty cycle (typically the ratio of the ON time of the switch to the total switching period), varying the switching frequency or varying the number of pulses per unit time of the switch in a switched mode power converter.

The switched mode power converter also includes a controller. Output regulation may be achieved by sensing and controlling the output by employing a closed loop feedback topology. The controller may receive a signal representative of the output and the controller varies one or more parameters in response to the signal to regulate the output to a desired target. Properties, such as efficiency, size, weight and cost are usually taken into account when designing a switched mode power converter. The controller may also be designed to sense and respond to an input signal, such as an input voltage source.

For example, the controller may sense and respond to any input signal when the controller provides power factor correction (PFC) to improve the power factor of the power converter. Power factor may be defined as the ratio of the average power over a cycle to the product of the root mean square (rms) voltage and the rms current. In other words, the power factor may represent the ratio of the amount of usable power to the amount of total power delivered to the load. As such, the power factor may have a value between zero and one, with unity power factor being the ideal. A controller of a switched mode power converter may sense the input signal and perform PFC in an attempt to achieve unity power factor, typically by shaping the input current waveform as closely as possible to the input voltage waveform.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
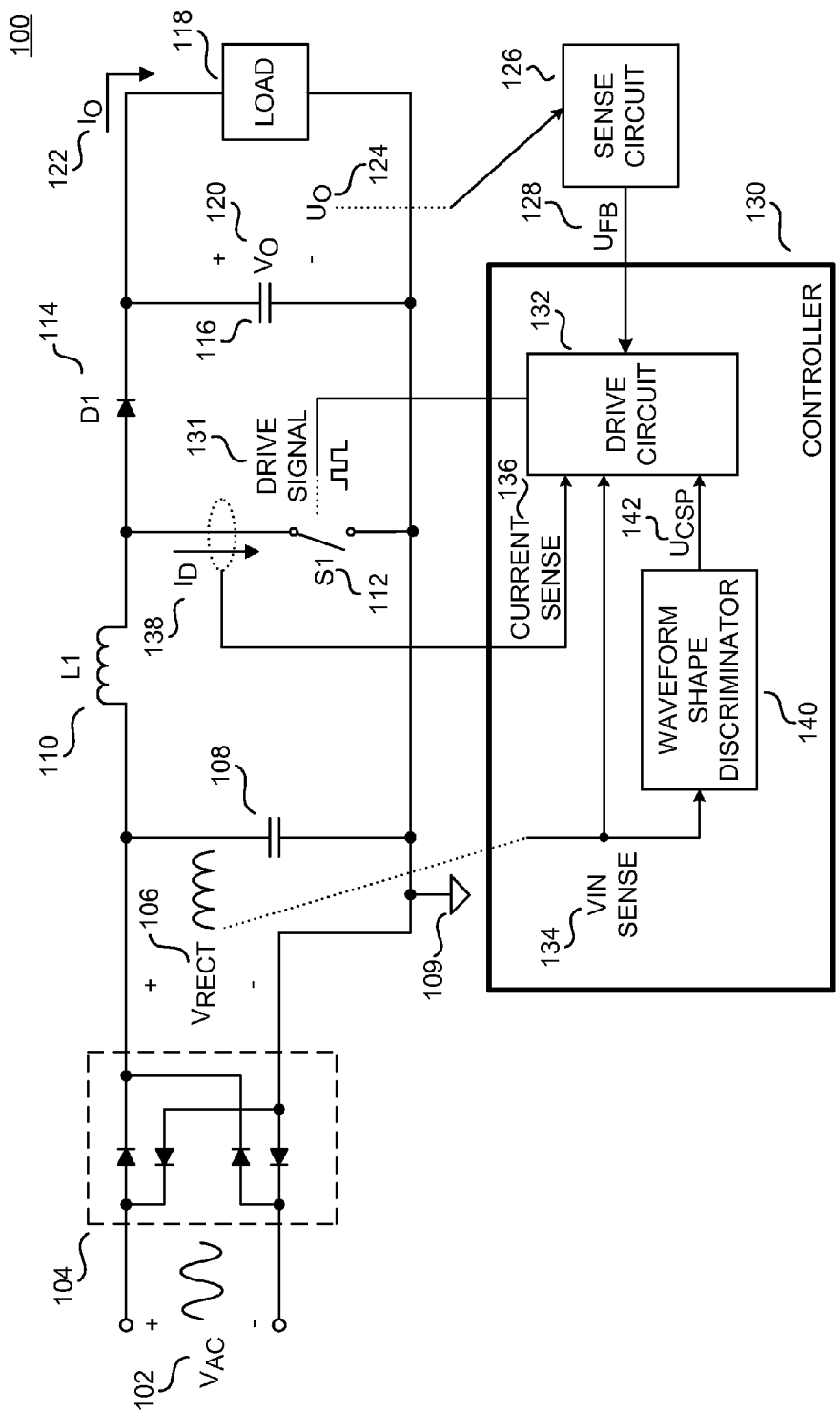
FIG. 1 is a diagram illustrating an example switched mode power converter utilizing a controller in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Controllers for switched mode power converters may sense and respond to an input signal, such as an input voltage signal or an input current signal. For power converters that are ac to dc power converters, the shape of the input voltage signal is generally a sinusoid. For example, the input voltage signal may be an ac input voltage and the period of the ac input voltage is referred to as a full line cycle. As such, half the period of the ac input voltage is referred to as a half line cycle. In some cases, an uninterruptible power supply (UPS) may be coupled to the switched mode power converter to provide the input voltage signal. The input voltage signal provided by the UPS is generally sinusoidal, however the shape of the input voltage signal may look more like a square wave as the UPS loses power. The distorted waveform (i.e., the square shape of the input voltage signal) may cause issues for the power converter. For example, the power converter may experience the "hiccuping effect" in which the power converter cycles between a brown-out condition and a brown-in condition if the power converter does not adjust for the distorted waveform. In another example, it may be desirable to determine the shape of the input voltage signal to alter various functions of the power converter, such as the feed-forward control of the power converter and the maximum output power delivery. For example, the power converter may deliver more output power when the shape of the input voltage sense signal is closer to a square than a sinusoid. The feed-forward gain constant of the power converter may be altered in response to the shape of the input voltage signal to prevent over delivery of the output power.

In examples of the present disclosure, a controller utilizes a waveform shape discriminator that may discriminate between various waveform shapes. The waveform shape discriminator may receive an input sense signal representative of an input of the power converter. A running maximum finder circuit may also receive the input sense signal and identifies the maximum value of the input sense signal within a search window. In other words, the output of the running maximum finder circuit (referred to as the maximum signal) is the current maximum value of the input sense signal within the search window. In one example, the waveform shape discriminator compares the input sense signal to a scaled version of the maximum signal outputted from the running maximum finder circuit. The amount of time in the search window that the input sense signal was above or below the running maximum threshold signal may discriminate between various waveform shapes.

Referring first to the example depicted in FIG. 1, an example power converter 100 is shown including a rectifier 104, an input capacitor 108, an energy transfer element L1 110, a power switch S1 112, an output rectifier D1 114, an output capacitor 116, an output sense circuit 126, and a controller 130. Controller 130 further includes a drive circuit 132 and a waveform shape discriminator 140. FIG. 1 further illustrates an input ac voltage $V_{AC}$ 102, a rectified voltage VRECT 106, a load 118, an output voltage $V_O$ 120, an output current $I_O$ 122, an output quantity $U_O$ 124, a feedback signal $U_{FB}$ 128, an input sense signal 134, a current sense signal 136, and a drive signal 131. The example power converter 100 illustrated in FIG. 1 is coupled in a boost configuration, which is just one example of a switched mode power converter that may benefit from the teachings of the present invention. In one example, the example power converter 100 of FIG. 1 may be utilized as a power factor correction (PFC) converter. It is appreciated that other known topologies and configurations of switched mode power converters may also benefit from the teachings of the present invention.

In the illustrated example, the power converter 100 provides output power to the load 118 from an unregulated input voltage. In one example, the input voltage is the ac input voltage $V_{AC}$ 102. The ac input voltage $V_{AC}$ 102 may be an ac line voltage, which can be provided from a conventional wall outlet. In another example, the input voltage is a rectified ac input voltage such as the rectified voltage $V_{RECT}$ 106. As shown, the rectifier 104 receives an ac input voltage $V_{AC}$ 102 and produces a rectified voltage $V_{RECT}$ 106. In the example shown, input capacitor 108 is coupled across the output of rectifier 104 and may filter high frequency current through the power switch S1 112. For some applications, the value of the input capacitor 108 may be large enough such that a substantially constant dc voltage is applied to the energy transfer element L1 114. However, for power converters utilized in power factor correction (PFC), the value of the input capacitor 108 is small and the input capacitor 108 may be utilized to allow the voltage applied to the energy transfer element L1 110 to substantially follow the rectified voltage $V_{RECT}$ 106.

In one example, the ac input voltage $V_{AC}$ 102 is a sinusoidal waveform with the period of the ac input voltage $V_{AC}$ 102 referred to as a full line cycle. Mathematically: $V_{AC}(t)=V_P \sin(2\pi f_L t)$, where $V_P$ is the peak voltage of the ac input voltage $V_{AC}$ 102 and $f_L$ is the frequency of the line input voltage. In other words, $f_L$ is the line frequency of the ac input voltage $V_{AC}$ 102. It should be appreciated that the full line cycle is the reciprocal of the line frequency $f_L$, or mathematically: full line cycle=$1/f_L$. As mentioned above, the rectified voltage $V_{RECT}$ 106 is the resultant output of the bridge rectifier 104 when the input to the bridge rectifier 104 is the ac input voltage $V_{AC}$ 102. In one example, the $V_{RECT}$ 106 output of bridge rectifier 104 is of a positive magnitude, or mathematically: $V_{RECT}=|V_{AC}|=|V_P \sin(2\pi f_L t)|$. As a result, the rectified voltage $V_{RECT}$ 106 repeats every half line cycle.

In the example shown, energy transfer element L1 110, power switch S1 112, and rectifier D1 114 are coupled together in a boost converter configuration. The bridge rectifier 104 is coupled to one end of energy transfer element L1 110. In one example, the energy transfer element L1 110 is an inductor. The other end of energy transfer element L1 110 is further coupled to the power switch S1 112 and the output rectifier D1 114, which is exemplified as a diode in the example depicted in FIG. 1. However, in some examples, the output rectifier D1 114 may be a transistor used as a synchronous rectifier. As illustrated, one end of power switch S1 112 is coupled between the energy transfer element L1 110 and the output rectifier D1 114 while the other end of power switch S1 112 is coupled to input return 109. Output capacitor 116 is shown as coupled to both the power switch S1 112 and the output rectifier D1 114. Load 118 is coupled across the output capacitor 116. An output is provided to the load 118 and may be provided as either an output voltage $V_O$ 120, an output current $I_O$ 122, or a combination of the two.

As shown in the depicted example, power converter 100 further includes circuitry to regulate the output, which is exemplified as output quantity $U_O$ 124. An output sense circuit 126 is coupled to sense the output quantity $U_O$ 124 and to provide feedback signal $U_{FB}$ 128, which is representative of the output quantity $U_O$ 124. Feedback signal $U_{FB}$ 128 may be voltage signal or a current signal.

In the example shown in FIG. 1, controller 130 is coupled to the output sense circuit 126 and receives the feedback signal $U_{FB}$ 128 from the output sense circuit 126. The controller 130 is further coupled to receive the current sense signal 136 and is coupled to provide the drive signal 131 to power switch S1 112. The current sense signal 136 may be representative of the switch current $I_D$ 138 through power switch S1 112. Current sense signal 136 may be a voltage signal or a current signal. In one example, controller 130 may also be coupled to receive an input sense signal 134. Input sense signal 134 may be representative of an input of the power converter 100. In one example, the input sense signal 134 may be representative of the input voltage of the power converter 100. Further, input sense signal 134 may be representative of the rectified voltage $V_{RECT}$ 106, the voltage across capacitor 108, or the ac input voltage $V_{AC}$ 102. Input sense signal 134 may be a voltage signal or a current signal.

In addition, the controller 130 provides drive signal 131 to the power switch S1 112 to control various switching parameters to control the transfer of energy from the input of power converter 100 to the output of power converter 100. Examples of such parameters may include switching frequency, switching period, duty cycle, or respective ON and OFF times of the power switch S1 112.

As illustrated in FIG. 1, controller 130 includes the waveform shape discriminator 140 and the drive circuit 132. In one example, the waveform shape discriminator 140 is coupled to receive the input sense signal 134 and outputs a confirmed shape signal $U_{CSP}$ 142 to the drive circuit 132. As will be discussed, in another example, the waveform shape discriminator 140 may output a shape signal $U_{SP}$ to the drive circuit 132. In one example, the confirmed shape signal $U_{CSP}$ 142 may indicate the shape of the input sense signal 134. In other words, the confirmed shape signal $U_{CSP}$ 142 may indicate the shape of an input of the power converter 100, such as an input voltage of the power converter. In one example, the confirmed shape signal $U_{CSP}$ 142 may be a rectangular pulse waveform with varying lengths of logic high and logic low sections. The logic low value may correspond to a first shape, while the logic high value corresponds to a second shape. It should be appreciated that the waveform shape discriminator 140 may discriminate between any N number of shapes. For example, the confirmed shape signal $U_{CSP}$ 142 may have N number of values and each value corresponds to a shape.

The drive circuit 132 is also coupled to receive the input sense signal 134 and the current sense signal 136. The drive circuit 132 outputs the drive signal 131 to control switching of the power switch S1 112 in response to the confirmed shape signal $U_{CSP}$ 142, the current sense signal 135, the input sense signal 134, and the feedback signal $U_{FB}$ 128. In one example, drive signal 131 is a rectangular pulse waveform with varying lengths of logic high and logic low sections. In addition, the time between rising edges of the drive signal 152 is substantially equal to the switching period $T_S$ of the power converter 100. It is generally understood that a switch that is closed may conduct current and is considered on, while a switch that is open cannot conduct current and is considered off. In one example, the power switch S1 112 may be a transistor such as a metal-oxide-semiconductor field-effect transistor (MOSFET). In another example, controller 130 may be implemented as a monolithic integrated circuit or may be implemented with discrete electrical components or a combination of discrete and integrated components. In one example, controller 130 and power switch S1 112 could form part of an integrated circuit that is manufactured as either a hybrid or a monolithic integrated circuit.

As will be discussed in greater detail below, the waveform shape discriminator 140 in one example includes a running maximum finder circuit which receives the input sense signal 134 and identifies the maximum value of the input sense signal within a search window. One example of the search window may be the half line cycle of the input voltage (ac input voltage $V_{AC}$ 102 or rectified voltage $V_{RECT}$ 106). In other words, the output of the running maximum finder circuit (referred to as the maximum signal) is the current maximum value of the input sense signal 134 within the search window. In one example, the waveform shape discriminator 140 compares the input sense signal 134 to a scaled version of the maximum signal outputted from the running maximum finder circuit. The amount of time in the search window, which the input sense signal 134 was above or below the running maximum threshold signal may be utilized to discriminate between various waveform shapes. The confirmed shape signal $U_{CSP}$ 142 may indicate the shape of the input signal in response to the amount of time the input sense signal 134 was above or below the running maximum threshold signal.

The controller 130 may utilize the confirmed shape signal $U_{CSP}$ 142 to control switching of the power switch S1 112. For instance, in one example the controller 130 may vary the value of the brown-in threshold and the brown-out threshold in response to the shape of the input signal, as indicated for example by the confirmed shape signal $U_{CSP}$ 142. In general, if the input voltage falls below the brown-out threshold, the controller turns off. Once the input voltage is greater than the brown-in threshold, the controller turns on.

Figure 2:
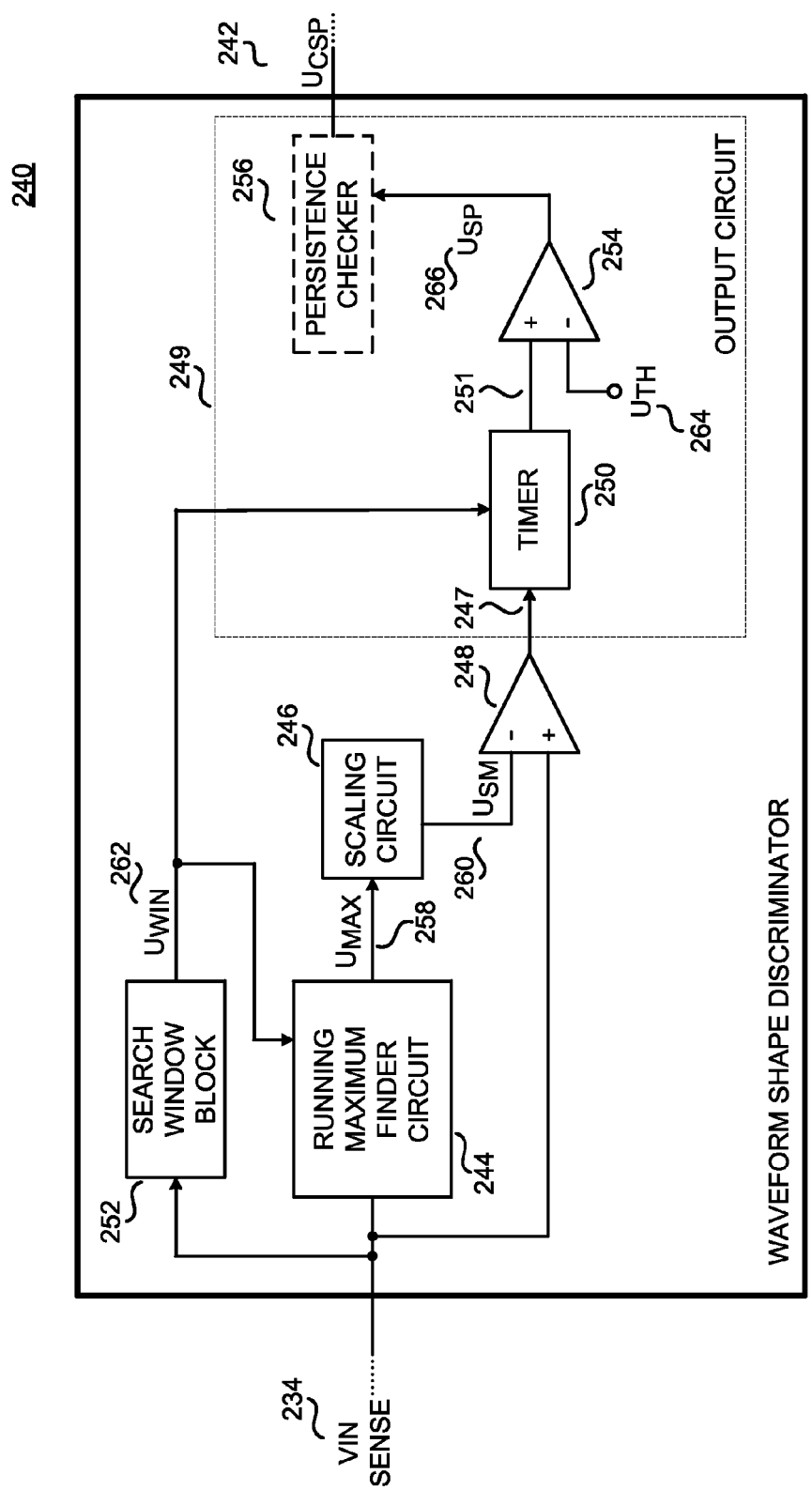
FIG. 2 is a diagram illustrating one example of the waveform shape discriminator of FIG. 1 in accordance with the teachings of the present invention.

FIG. 2 illustrates an example waveform shape discriminator 240, which in one example may be waveform shape discriminator 140 of FIG. 1. It should be appreciated that similarly named and numbered elements referenced below are coupled and function as described above. In one example, waveform shape discriminator 240 includes a running maximum finder circuit 244 that is coupled to receive an input sense signal 234. In one example, running maximum finder circuit 244 is coupled to update a running maximum signal $U_{MAX}$ 258 in response to the input sense signal 234 and a window signal $U_{WIN}$ 262.

A first comparator 248 is coupled to receive the input sense signal 234 and a running maximum threshold signal $U_{SM}$ 260, which is representative of the running maximum signal $U_{MAX}$ 258. As illustrated in the depicted example, the input sense signal 234 is received at the non-inverting input of comparator 248 and the running maximum threshold signal $U_{SM}$ 260 is received at the inverting input of comparator 248. The output 247 of the comparator 248 is then coupled to be received by the output circuit 249. The current maximum value of the input sense signal is output to the scaling circuit 246 as maximum signal $U_{MAX}$ 258. In one example, the search window is substantially equal to the half line cycle of the rectified input voltage $V_{RECT}$ or the ac input voltage $V_{AC}$ and the running maximum finder circuit 244 may identify the current maximum value of the input sense signal 234 for each half line cycle. In another example, the running maximum finder circuit 244 may identify the running maximum value of the input sense signal 234 from the previous half line cycle. In that case, the maximum signal $U_{MAX}$ 258 may be representative of the peak value of the input sense signal 234 from the previous half line cycle. It should be appreciated that the running maximum finder circuit 244 and search window block 252 may be included as parts of other circuits within the controller.

In one example, the running maximum threshold signal $I_{SM}$ 260 is output from a scaling circuit 246 in response to the running maximum signal $U_{MAX}$ 258. Scaling circuit 246 is coupled to receive the maximum signal $U_{MAX}$ 258 and output a scaled version of the maximum signal $U_{MAX}$ 258, referred to as running maximum threshold signal $U_{SM}$ 260. The running maximum threshold signal $U_{SM}$ 260 may be a voltage signal or a current signal. In one example, the scaling circuit 246 is a multiplier which multiples the received maximum signal $U_{MAX}$ 258 to a scaling factor K. In one example, the resultant running maximum threshold signal $U_{SM}$ 260 is substantially equal to the product of the maximum signal $U_{MAX}$ 158 and the scaling value K, or mathematically: $U_{SM}=KU_{MAX}$. It should be appreciated that any number of arithmetic operators may be utilized within the scaling circuit 246 to produce the running maximum threshold signal $U_{SM}$ 260. In one example, the scaling circuit scales the maximum signal $U_{MAX}$ 258 to a smaller value. Or in other words, the scaling factor K is less than one.

A search window block 252 is coupled to receive the input sense signal 234 to detect a search window in the input sense signal 234. The search window block 252 outputs the window signal $U_{WIN}$ 262 in response to the input sense signal 234. The window signal $U_{WIN}$ 262 may be a voltage signal or current signal and may provide a "search window" to other blocks within the controller. The search window may represent a time period for which other blocks may perform their respective functions. One example of the "search window" may be the half line cycle of the rectified input voltage $V_{RECT}$ or the ac input voltage $V_{AC}$. This search window represents a time period for which the running maximum finder circuit 244 may identify the maximum value of the input sense signal 234. In other words, the running maximum finder circuit 244 outputs the current maximum value of the input sense signal 234 within the search window provided by the window signal $U_{WIN}$ 262. As illustrated, the running maximum finder circuit 244 and a timer 250 are coupled to receive the window signal $U_{WIN}$ 262.

As shown in the example, an output circuit 249 is coupled to an output 247 of the first comparator 248 and the output $U_{WIN}$ 262 of the search window block 252 to determine a presence of a waveform shape in the input sense signal 234 within the search window in the input sense signal 234. In one example, the presence of the waveform shape in the input sense signal 234 within the search window in the input sense signal 234 may be indicated with a shape signal $U_{SP}$ 266.

In one example, output circuit 249 includes the timer 250 as well as a comparator 254. Timer 250 is coupled to receive the output 247 the window signal $U_{WIN}$ 262 which provides a search window to the timer 250. In the example shown, the timer 250 determines the amount of time which the input sense signal 234 is greater than the running maximum threshold signal $U_{SM}$ 260 within the search window. For example, the window signal $U_{WIN}$ 262 may provide information to the timer 260 on when to reset. In another example, the comparator output 247 may be an enable/disable signal which enables the timer 250 when the input sense signal 234 is greater than or substantially equal to the running maximum threshold signal $U_{SM}$ 260 and disables the timer when the input sense signal 234 is less than the running maximum threshold signal $U_{SM}$ 260. Although, it should be appreciated that the timer 250 may be enabled when the input sense signal 234 is greater than the running maximum threshold signal $U_{SM}$ 260 and may be disabled when the input sense signal 234 is less than or substantially equal to the running maximum threshold signal $U_{SM}$ 260. At the end of the search window provided by the window signal $U_{WIN}$ 262, the amount of time which the input sense signal 234 is greater than the running maximum threshold signal $U_{SM}$ 260 is outputted to the comparator 254 as output 251. In another example, the timer 250 may determine the difference between the amount of time which the input sense signal 234 is greater than or substantially equal to the running maximum threshold signal $U_{SM}$ 260 and less than the running maximum threshold signal $U_{SM}$ 260. For example, the timer may be incremented when the input sense signal 234 is greater than the running maximum threshold signal $U_{SM}$ 260 and the timer may be decremented when the input sense signal 234 is less than the running maximum threshold signal $U_{SM}$ 260.

In the example shown, the comparator 254 is coupled to receive the output 251 of the timer 250 and the threshold signal $U_{TH}$ 265. As illustrated, the output 251 is received at the non-inverting input while a threshold signal $U_{TH}$ 265 is received at the inverting input of comparator 254. In one example, if the output 251 is less than the threshold signal $U_{TH}$ 265, the shape signal $U_{SP}$ 266 indicates that the shape of the input sense signal 234 is a first shape. If the output 251 is greater than the threshold signal $U_{TH}$ 265, the shape signal $U_{SP}$ 266 indicates that the shape of the input sense signal 234 is a second shape. In one example, the shape signal $U_{SP}$ 266 is a rectangular pulse waveform with varying lengths of logic high and logic low sections. The shape signal USP 266 may be logic low when the waveform shape discriminator 240 determines that the shape of the input sense signal 234 is the first shape and logic high when it is the second shape. It should be appreciated that multiple threshold values may be utilized to differentiate the shape of the input sense signal 234 between any number of shapes. For example, to discriminate between N number of shapes, an N–1 number of thresholds may be utilized.

The output circuit 249 of waveform shape detector 240 may also optionally utilize a persistence checker 256. The persistence checker 256 is coupled to receive the shape signal $U_{SP}$ 266 and outputs the confirmed shape signal $U_{CSP}$ 242. In one example, the persistence checker 256 waits for M number of consecutive search windows in which the value of the shape signal $U_{SP}$ 266 is the same before outputting the confirmed shape signal $U_{CSP}$ 242 with the same value as the shape signal $U_{SP}$ 266. For the example which the shape signal $U_{SP}$ 266 is a rectangular pulse waveform, the shape signal $U_{SP}$ 266 must be logic high or logic low (indicating that the input sense signal is the first shape or the second shape) for M number of consecutive search windows for the confirmed shape signal $U_{CSP}$ 242 to transition to a logic high value or logic low value. In one example, M may be substantially equal to three. If the waveform detector 240 does not utilize a persistence checker 256, the confirmed shape signal $U_{CSP}$ 242 is substantially equal to the shape signal $U_{SP}$ 266.

Figure 3:
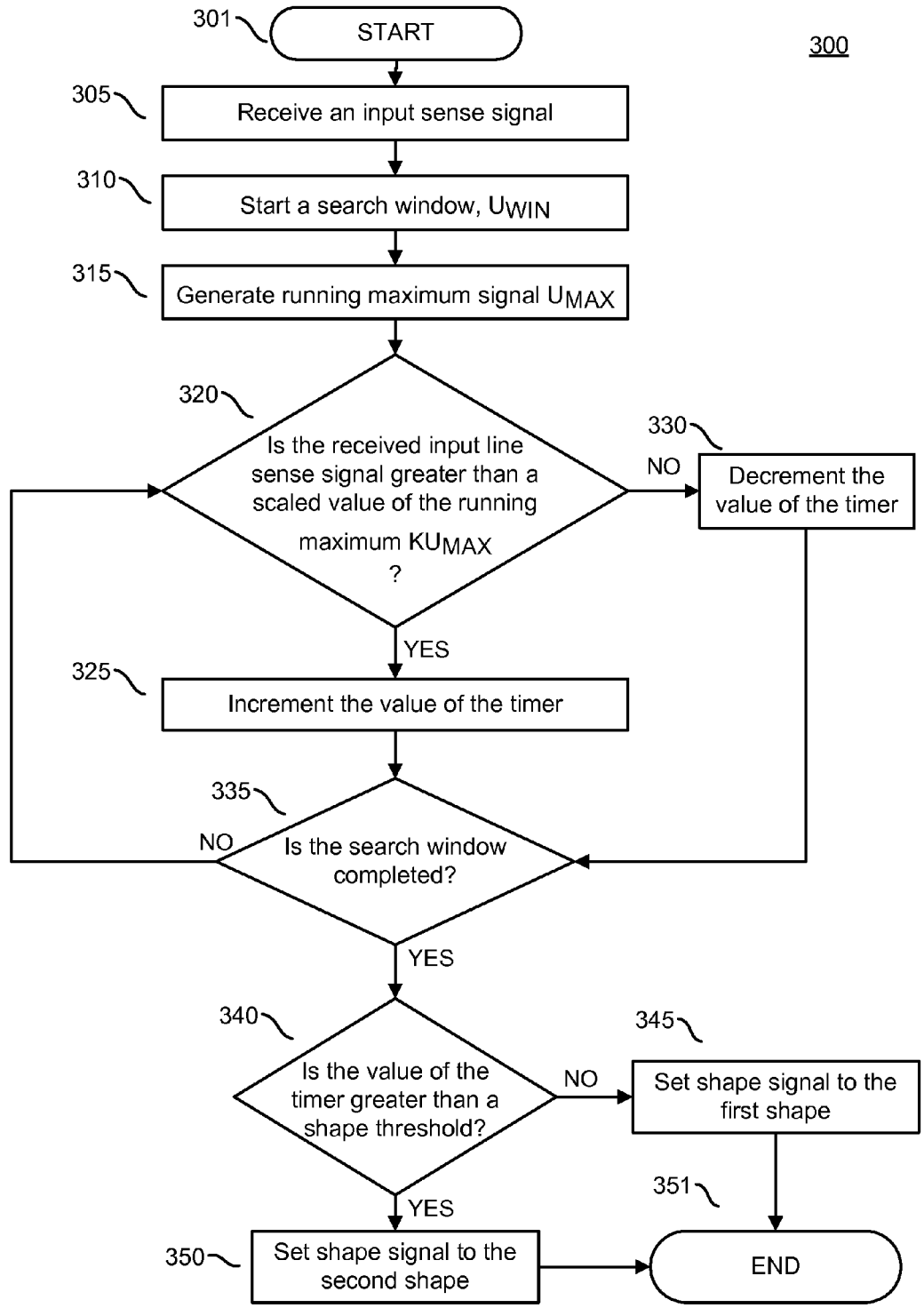
FIG. 3 is a flow chart illustrating an example process for discriminating a shape of a waveform, in accordance with the teachings of the present invention.

FIG. 3 is a flow chart illustrating an example process 300 for discriminating the shape of a waveform in accordance with the teachings of the present invention. Process 300 may be performed using a circuit similar or identical to the waveform shape discriminator 240 shown in FIG. 2 or the example waveform shape discriminator 540 shown below in FIGS. 5A and 5B. As shown in the depicted example, process 300 may begin at block 301 and then at block 305, an input sense signal may be received. In one example, the input sense signal may be representative of the ac input voltage $V_{AC}$ and/or the rectified input voltage $V_{RECT}$.

At block 310, a search window may be started. In one example, the search window may be responsive to the input sense signal. For example, the length of the search window may be the half line cycle of the ac input voltage $V_{AC}$ or the rectified input voltage $V_{RECT}$. In general, the half line cycle can be measured as the time between zero crossings of the ac input voltage $V_{AC}$. The zero-crossing generally refers to when the ac input voltage $V_{AC}$ crosses zero voltage. In other words, the zero crossing refers to when the polarity of the ac input voltage changes from positive to negative or from negative to positive. The time between every other zero crossing is generally the full line cycle while the time between zero crossings is generally the half line cycle.

In one example, the search window may be started after the zero crossing of the ac input voltage $V_{AC}$. In one example, as will be further discussed, a zero crossing circuit may receive the input sense signal and compare the input sense signal with a zero crossing threshold. If the input sense signal is less than the zero crossing threshold, the zero crossing circuit determines that the input sense signal has reached zero crossing. The zero crossing circuit may output a zero crossing signal which is a rectangular pulse waveform which pulses to a logic high value at a zero crossing of the input sense signal.

At block 315, a running maximum signal $U_{MAX}$ is generated. The running maximum signal may be responsive to the input sense signal and the search window. In one example, the running maximum signal $U_{MAX}$ may output the current maximum value of the input sense signal within the search window.

At decision block 320, the input sense signal is compared to a scaled running maximum signal ($KU_{MAX}$). In one example, the value of the scaled running maximum signal is less than the running maximum signal $U_{MAX}$. Or in other words, the scaling factor K is less than one. In one example, the scaled running maximum signal may also be referred to as the running maximum threshold signal $U_{SM}$. If the value of the input sense signal is greater than or substantially equal to the scaled running maximum signal ($KU_{MAX}$), then the process 300 proceeds to block 325 and the value of a timer is incremented. If the value of the input sense signal is less than the scaled running maximum signal ($KU_{MAX}$), then the process 300 proceeds to block 330 and the value of the timer is decremented. In another example, the value of the timer is neither incremented nor decremented if the value of the input sense signal is less than the scaled running maximum signal ($KU_{MAX}$).

Both blocks 325 and 330 then proceed to decision block 335, where it is determined whether the search window $U_{WTN}$ has been completed. In the example mentioned above with regards to the zero crossing of the input sense signal, the search window may be completed if another zero crossing pulse has been received. If the search window has not been completed, the process returns to decision block 320. However, if the search window has been completed, the process 300 continues to decision block 340.

At decision block 340, the value of the timer at the end of the search window is compared to a shape threshold. If the value of the timer is less than the shape threshold, then the process 300 proceeds to block 345 and the shape signal is set to the first shape. However, if the value of the timer is greater than the shape threshold, then the process 300 proceeds to block 350 and the shape signal is set to the second shape. The process 300 ends at block 351.

It should be appreciated that the process 300 may also include a block to determine if the shape signal was set to either the first shape or the second shape for M number of consecutive search windows as discussed with respect to persistence checker 256. In other words, the process 300 shown may be for an example in which M is substantially equal to one.

Figure 4:
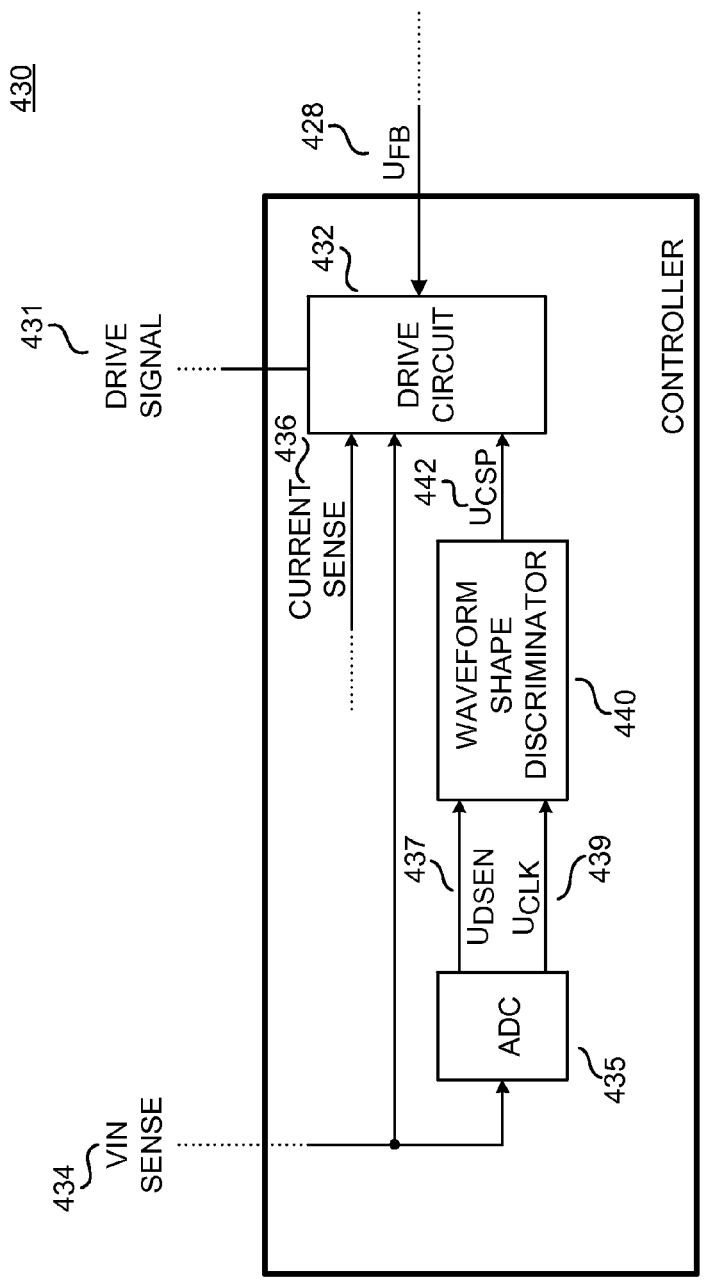
FIG. 4 is a diagram illustrating another example of the controller of FIG. 1 in accordance with the teachings of the present invention.

FIG. 4 illustrates another example of the controller 430, which may be one example of controller 130 of FIG. 1. Controller 430 is similar to the controller 130 discussed above, with the addition of an analog-to-digital converter (ADC) 435. The ADC 435 may be coupled to receive the input sense signal 434 and configured to output a digital sense signal $U_{DSEN}$ 437, which is a digitized version of the input sense signal 434. The digital sense signal $U_{DSEN}$ 437 may include a sequence of digital count signals (i.e., samples) that are separated by the sampling period. Each digital count signal may represent the value of the line sense signal 434 at a certain instance in time. In one example, each digital count signal may include a 9-bit binary signal. As shown, the waveform shape discriminator 440 may be coupled to receive the digital sense signal $U_{DSEN}$ 437 and the sampling clock signal $U_{CLK}$ 439. In one example, the sampling clock signal $U_{CLK}$ 439 is representative of the sampling period (or sampling frequency) of the ADC 435. While FIG. 4 shows the waveform shape discriminator 440 receiving sampling clock signal $U_{CLK}$ 439 from the ADC 435, in other examples, the waveform shape discriminator 440 may receive sampling clock signal $U_{CLK}$ 439 from other sources within or external to controller 430. In another example, the ADC 435 may be included in the waveform shape discriminator 440.

In the depicted example, waveform shape discriminator 440 is coupled to output a confirmed shape signal $U_{CSP}$ 442 to the drive circuit 432 in response to the digital sense signal $U_{DSEN}$ 437. The confirmed shape signal $U_{CSP}$ 442 may indicate the shape of the input sense signal 434. In another example, waveform shape discriminator 440 may be coupled to output a shape signal $U_{SP}$, similar to for example shape signal $U_{SP}$ 266 of FIG. 2, to the drive circuit 432 in response to the digital sense signal $U_{DSEN}$ 437. In the depicted example, drive circuit 432 is shown coupled also to receive the current sense signal 436, input sense signal 434, and feedback signal $U_{FB}$ 428. As shown, the drive circuit 324 outputs the drive signal 431, which controls switching of a power switch in accordance with the teachings of the present invention.

Figure 5A:
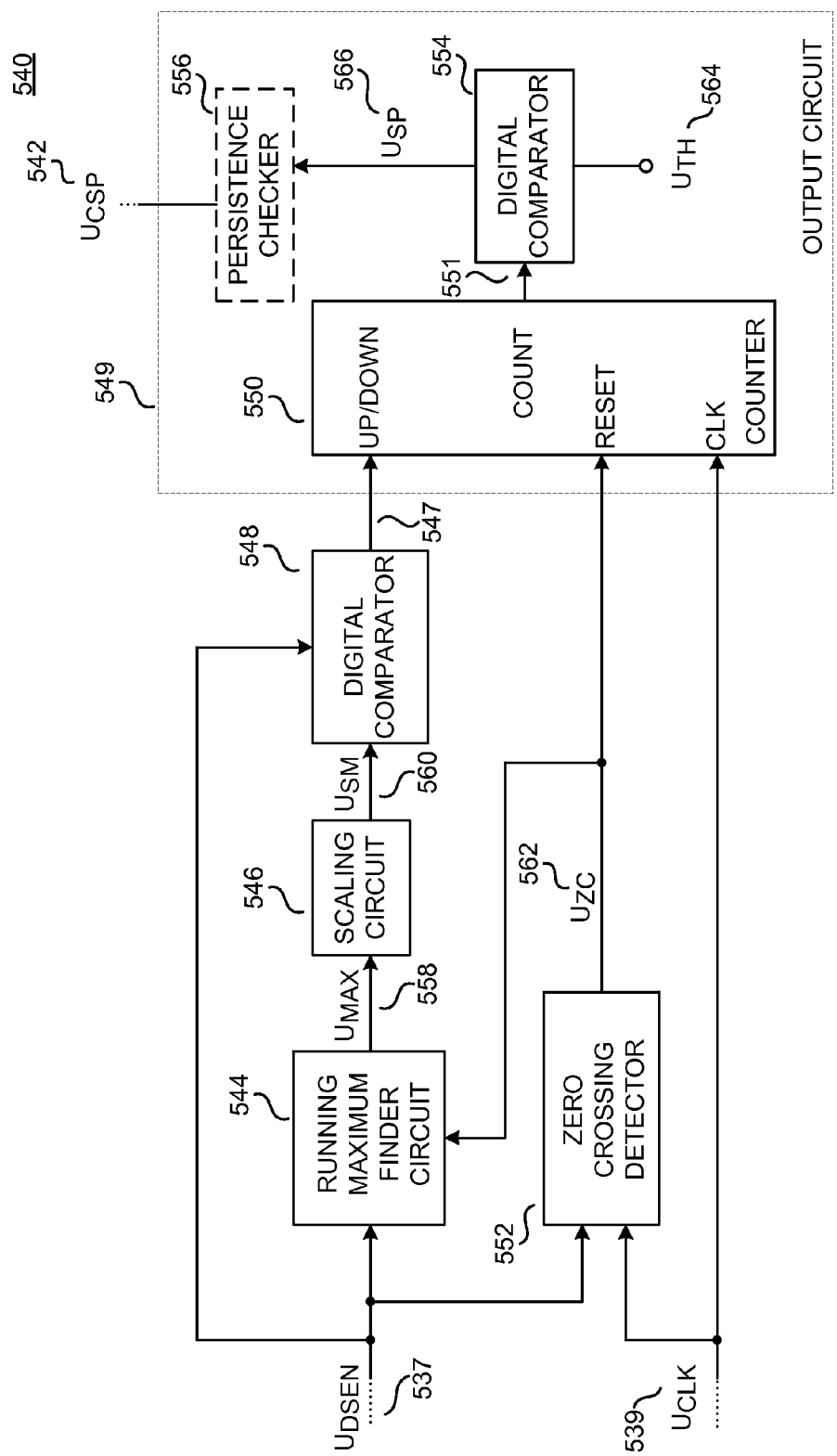
FIG. 5A is a diagram illustrating another example of the waveform shape discriminator of FIG. 4 in accordance with the teachings of the present invention.

FIG. 5A illustrates another example of the waveform shape discriminator 540, which is one example of the waveform shape discriminator 440 of FIG. 4 in accordance with the teachings of the present invention. The waveforms shape discriminator 540 is shown including a running maximum finder circuit 544, a scaling circuit 546, a digital comparator 548, a zero crossing detector 552, and an output circuit 549. Output circuit 549 further includes a counter 550, and a digital comparator 554. The waveform shape discriminator may also optionally include the persistence checker 556. In one example, waveform shape discriminator 540 is a digital version of the waveform shape discriminator 240 illustrated in FIG. 2.

Zero crossing detector 552 is coupled to receive the digital sense signal $U_{DSEN}$ 537 and the sampling clock signal $U_{CLK}$ 539. The zero crossing detector 552 is one example of the search window block 252. In one example, the zero crossing detector 552 provides the zero crossing signal $U_{ZC}$ 562 (which is one example of the window signal $U_{WTN}$ 262) that indicates when a zero crossing has occurred in the digital sense signal $U_{DSEN}$ 537. The zero-crossing generally refers to when the ac input voltage $V_{AC}$ crosses zero voltage. In other words, the zero crossing refers to when the polarity of the ac input voltage changes sign from positive to negative or from negative to positive. The time between every other zero crossing is generally the full line cycle while the time between zero crossings is generally the half line cycle. Zero crossing detector 552 may be configured to output a zero crossing signal $U_{ZC}$ 562 indicating the occurrence of the value of digital sense signal $U_{DSEN}$ 537 falling to a value equal to or less than a detection threshold, which may be a value that can be used to identify half line cycles of the ac input voltage $V_{AC}$ or the rectified input voltage $V_{RECT}$ 106. In an ideal case, the detection threshold may be zero volts. However the ADC 435 of FIG. 4 may have a low frequency pole that results in an averaging of digital sense signal $U_{DSEN}$ 537 over the sampling period of ADC 435. Furthermore, capacitor 108 shown in FIG. 1 may not fully discharge during the zero crossing of input voltage $V_{AC}$ 102 when power converter 100 is operating with a light load. As such the digital sense signal $U_{DSEN}$ 537 may not reach zero volts. As a result, the detection threshold may be set to a non-zero. For the example shown, the zero crossing signal $U_{ZC}$ 562 may be utilized to set the search window for the running maximum finder circuit 544 and the counter 550 (which is one example of the timer 250). In one example, the search window may be the time between zero crossings.

Running maximum finder circuit 544 is coupled to receive the digital input sense signal $U_{DSEN}$ 537 and the zero crossing signal $U_{ZC}$ 562. The running maximum finder circuit 544 outputs the maximum signal $U_{MAX}$ 258 in response to the digital input sense signal $U_{DSEN}$ 537 and the zero crossing signal $U_{ZC}$ 562. As mentioned above, the zero crossing signal $U_{ZC}$ 562 provides a search window for the running maximum finder circuit 554. Running maximum finder circuit 554 may be configured to output a maximum signal $U_{MAX}$ 558 representative of the maximum value of digital line sense signal $U_{DSEN}$ 537 in each search window as defined by zero crossing signal $U_{ZC}$ 562. In one example, the search window provided by the zero crossing signal $U_{ZC}$ 562 is substantially equal to the half line cycle of the ac input voltage $V_{AC}$ or the rectified voltage $V_{RECT}$. As such the maximum signal $U_{MAX}$ 558 may be representative of the current peak value of the ac input voltage $V_{AC}$ or the rectified voltage $V_{RECT}$ in each half line cycle. In one example, maximum signal $U_{MAX}$ 558 may include a 9-bit binary signal. In operation, running maximum finder circuit 544 may set the maximum signal $U_{MAX}$ 558 to substantially zero at the zero crossing of the digital input sense signal $U_{DSEN}$ 537 (which is provided by the zero crossing signal $U_{ZC}$ 562 transitioning to a logic high value). As mentioned above, the zero crossing may indicate the start of the search window. As new samples of digital line sense signal $U_{DSEN}$ 537 arrive at a frequency determined by sampling clock signal $U_{CLK}$ 539, running maximum finder circuit 544 may compare the value represented by maximum signal $U_{MAX}$ 558 with each new sample. If the new sample is greater than the value represented by maximum signal $U_{MAX}$ 558, running maximum finder circuit 544 may change maximum signal $U_{MAX}$ 558 to represent the value of the new, larger sample. If, however, the new sample is not greater than the value represented by maximum signal $U_{MAX}$ 558, running maximum finder circuit 544 may leave maximum signal $U_{MAX}$ 558 unchanged. When zero crossing signal $U_{ZC}$ 562 becomes logic high again, indicating the end of the current search window and the start of a new search window, maximum signal $U_{MAX}$ 558 may again be set to a value representing zero.

Scaling circuit 546 is coupled to receive the maximum signal $U_{MAX}$ 558 and output a scaled version of the maximum signal $U_{MAX}$ 558, referred to as running maximum threshold signal $U_{SM}$ 560. In one example, the running maximum threshold signal $U_{SM}$ 560 may also be a 9-bit binary signal. In one example, the scaling circuit 246 is a multiplier which multiples the received maximum signal $U_{MAX}$ 258 to a scaling factor K. The resultant running maximum threshold signal $U_{SM}$ 560 is substantially equal to the product of the maximum signal $U_{MAX}$ 558 and the scaling value K, or mathematically: $U_{SM}=KU_{MAX}$. In operation, the scaling of the maximum signal $U_{MAX}$ 558 may be performed with division and subtraction. For instance, in one example, the scaling value K may substantially be equal to $15/16$. Multiplying the maximum signal $U_{MAX}$ 558 by $15/16$ is substantially equivalent to the difference between the maximum signal $U_{MAX}$ 558 and $1/16^{th}$ of the maximum signal $U_{MAX}$ 558, or mathematically: $15/16 U_{MAX}=U_{MAX}-1/16 U_{MAX}$. The maximum signal $U_{MAX}$ 558 may be a 9-bit binary signal and shifting the binary signal by 4 bits is substantially dividing by 16. For the example of a 9-bit binary signal, the divided result is a 5-bit binary signal. The scaling circuit 546 may then subtract the 5-bit binary signal ($1/16 U_{MAX}$) from the 9-bit binary signal ($U_{MAX}$) and the result is substantially $15/16 U_{MAX}$. For this example, the running maximum threshold signal $U_{SM}$ 560 would also be a 9-bit binary signal.

Digital comparator 548 is coupled to receive the running maximum threshold signal $U_{SM}$ 560 and the digital input sense signal $U_{DSEN}$ 537. The running maximum threshold signal $U_{SM}$ 560 is compared to the digital input sense signal $U_{DSEN}$ 537. In one example, the output 547 of the digital comparator 548 is logic high when the digital input sense signal $U_{DSEN}$ 537 is greater than or substantially equal to the running maximum threshold signal $U_{SM}$ 560 and logic low if the running maximum threshold signal $U_{SM}$ 560 is greater than the digital input sense signal $U_{DSEN}$ 537. It should be appreciated that the output 547 of digital comparator 548 may be logic high when the digital input sense signal $U_{DSEN}$ 537 is greater than the running maximum threshold signal $U_{SM}$ 560 and logic low if the running maximum threshold signal $U_{SM}$ 560 is greater than or substantially equal to the digital input sense signal $U_{DSEN}$ 537. The output of the digital comparator 548 is coupled to be received by the output circuit 549.

Output circuit 549 is coupled to receive the output 547 of the digital comparator 548, the zero crossing signal $U_{ZC}$ 562, and the sampling clock signal $U_{CLK}$ 529. As illustrated, the output circuit 549 includes the counter 550 and the digital comparator 554. In the depicted example, counter 550 is coupled to receive the output of the digital comparator 548, the zero crossing signal $U_{ZC}$ 562 and the sampling clock signal $U_{CLK}$ 539 at the up/down input, reset input, and clock input, respectively.

In operation, the counter 550 counts the number of times which the digital input sense signal $U_{DSEN}$ 537 is greater or less than the running maximum threshold signal $U_{SM}$ 560 within the search window provided by the zero crossing signal $U_{ZC}$ 562. The internal count of the counter 550 is then output as count 551. In operation, the counter 550 may set the internal count to substantially zero at the zero crossing of the digital input sense signal $U_{DSEN}$ 537, which is provided by the zero crossing signal $U_{ZC}$ 562 transitioning to a logic high value. As mentioned before, the sampling clock signal $U_{CLK}$ 539 is representative of the sampling period (or sampling frequency) of the ADC 435. In other words, the sampling clock signal $U_{CLK}$ 539 is representative of the frequency at which the digital input sense signal $U_{DSEN}$ 537 is updated. In one example, the sampling clock signal $U_{CLK}$ 539 may be a rectangular pulse waveform with the length of time between logic high pulses substantially equal to the sampling period of the ADC 435.

In one example, the internal count of the counter 550 may be updated at every pulse of the sampling clock signal $U_{CLK}$ 539. In one example, if the value received from the digital comparator 548 is logic high when the sampling clock signal $U_{CLK}$ 539 is logic high, the internal count of the counter 550 increments. If the value received from the digital comparator 548 is logic low when the sampling clock signal $U_{CLK}$ 539 is logic high, the internal count of the counter 550 decremented. In one example, the counter may be incremented or decremented by a count of 1. In another example, if the value received from the digital comparator 548 is logic low when the sampling clock signal $U_{CLK}$ 539 is logic high, the internal count of the counter 550 is neither incremented nor decremented. At the end of the search window provided by the zero crossing signal $U_{ZC}$ 562, the internal count is output as count 551 to the digital comparator 554. When the zero crossing signal $U_{ZC}$ 562 becomes logic high again, indicating the end of the current search window and the start of a new search window, the internal count of the counter 550 may again be set to a value representing zero.

Digital comparator 554 is coupled to receive the count 551 output from the counter 550 and the threshold signal $U_{TH}$ 564. In one example, if the count 551 is less than the threshold signal $U_{TH}$ 565, the shape signal $U_{SP}$ 566 indicates that the shape of the input sense signal 534 is a first shape. If the count 551 is greater than the threshold signal $U_{TH}$ 565, the shape signal $U_{SP}$ 566 indicates that the shape of the input sense signal 534 is a second shape. In one example, the shape signal $U_{SP}$ 566 is a rectangular pulse waveform with varying lengths of logic high and logic low sections. The shape signal $U_{SP}$ 566 may be logic low when the waveform shape discriminator 540 determines that the shape of the input sense signal 534 is the first shape and logic high when it is the second shape. It should be appreciated that multiple threshold values may be utilized to differentiate the shape of the input sense signal between any number of shapes. For example, to discriminate between N number of shapes, an N−1 number of thresholds may be utilized.

Figure 5B:
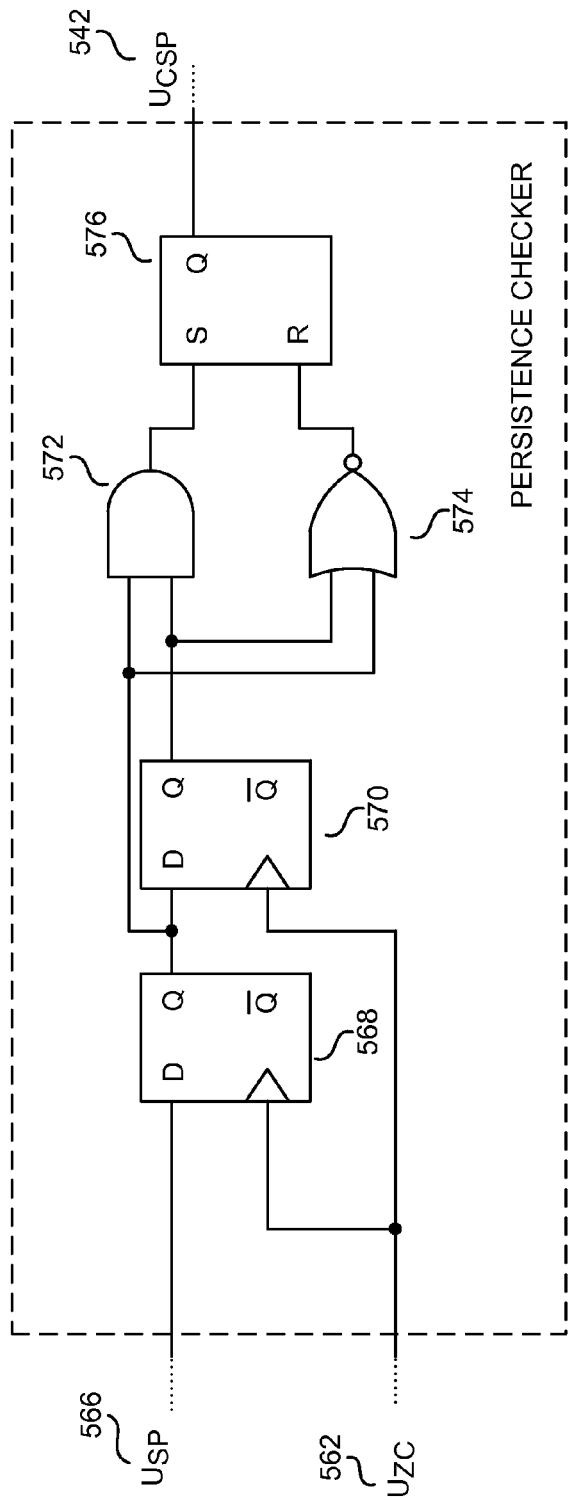
FIG. 5B is a diagram illustrating an example of the persistence checker of FIG. 5A in accordance with the teachings of the present invention.

In one example, an optionally included persistence checker 556 is coupled to receive the shape signal $U_{SP}$ 566 from digital comparator 554 as shown, which is further discussed with respect to FIG. 5B. The persistence checker 556 is coupled to receive the shape signal $U_{SP}$ 566 and outputs the confirmed shape signal $U_{CSP}$ 542. In one example, the persistence checker 556 waits for M number of consecutive search windows in which the value of the shape signal $U_{SP}$ 566 is the same before outputting the confirmed shape signal $U_{CSP}$ 542 with the same value as the shape signal $U_{SP}$ 566. For the example in which the shape signal $U_{SP}$ 566 is a rectangular pulse waveform, the shape signal $U_{SP}$ 566 is logic high or logic low (indicating that the input sense signal is the first shape or the second shape) for M number of consecutive search windows for the confirmed shape signal $U_{CSP}$ 542 to transition to a logic high value or logic low value. If the waveform detector 540 does not utilize a persistence checker 556, the confirmed shape signal $U_{CSP}$ 542 is substantially equal to the shape signal $U_{SP}$ 566.

FIG. 5B illustrates one example of the persistence checker 556 including flip-flops 568 and 570, AND gate 572, NOR gate 574, and latch 576. Persistence checker 556 is coupled to receive the shape signal $U_{SP}$ 566 and the zero crossing signal $U_{ZC}$ 562. As shown, the zero crossing signal $U_{ZC}$ 562 is coupled to be received at the clock inputs of both flip-flops 568 and 570. The shape signal $U_{SP}$ 566 is coupled to be received at the D-input of flip flop 568. Q-output of flip-flip 568 is further coupled to the D-input of flip-flop 570. Both the Q-outputs of flip-flops 568 and 570 are coupled to be received as inputs at both the AND gate 572 and the NOR gate 574. Latch 576 is coupled to receive the output of AND gate 572 at its S-input and the output of the NOR gate 574 at its R-input. The Q-output of the latch 576 is the confirmed shape signal $U_{CSP}$ 542. For the example persistence checker 556 illustrated, the confirmed shape signal $U_{CSP}$ 542 follows the shape signal $U_{SP}$ 566 if the shape signal $U_{SP}$ 566 is the same for two consecutive search windows. It should be appreciated that for M number of consecutive search windows, the persistence checker 556 would include M number of flip-flops and both the AND gate 572 and NOR gate 574 would each have M number of inputs.

In operation, the latch 576 is not set to a logic high value (and as such the confirmed shape signal $U_{CSP}$ 542 does not transition to a logic high value) unless the shape signal $U_{SP}$ 566 is logic high for two consecutive search windows. For example, if the shape signal $U_{SP}$ 566 is logic high for a current search window but was logic low during the previous search window, the output of the first flip-flop 568 is logic high while the output of the second flip-flop 570 is logic low. As such the output of AND gate 572 is logic high and latch 576 is not set to a logic high value. However, if the next search window is also logic high, both the Q-outputs of flip-flops 568 and 578 are logic high. The output of AND gate 572 is logic high and the latch 576 is set and the confirmed shape signal $U_{CSP}$ 542 transitions to a logic high value. The confirmed shape signal $U_{CSP}$ 542 remains logic high unless the shape signal $U_{SP}$ 566 falls to a logic low value for two consecutive search windows. In other words, the latch 576 is not reset until the output of the NOR gate 574 is logic high. The NOR gate 574 outputs a logic high value when both outputs of flip-flops 568 and 578 are logic low.

Figure 6:
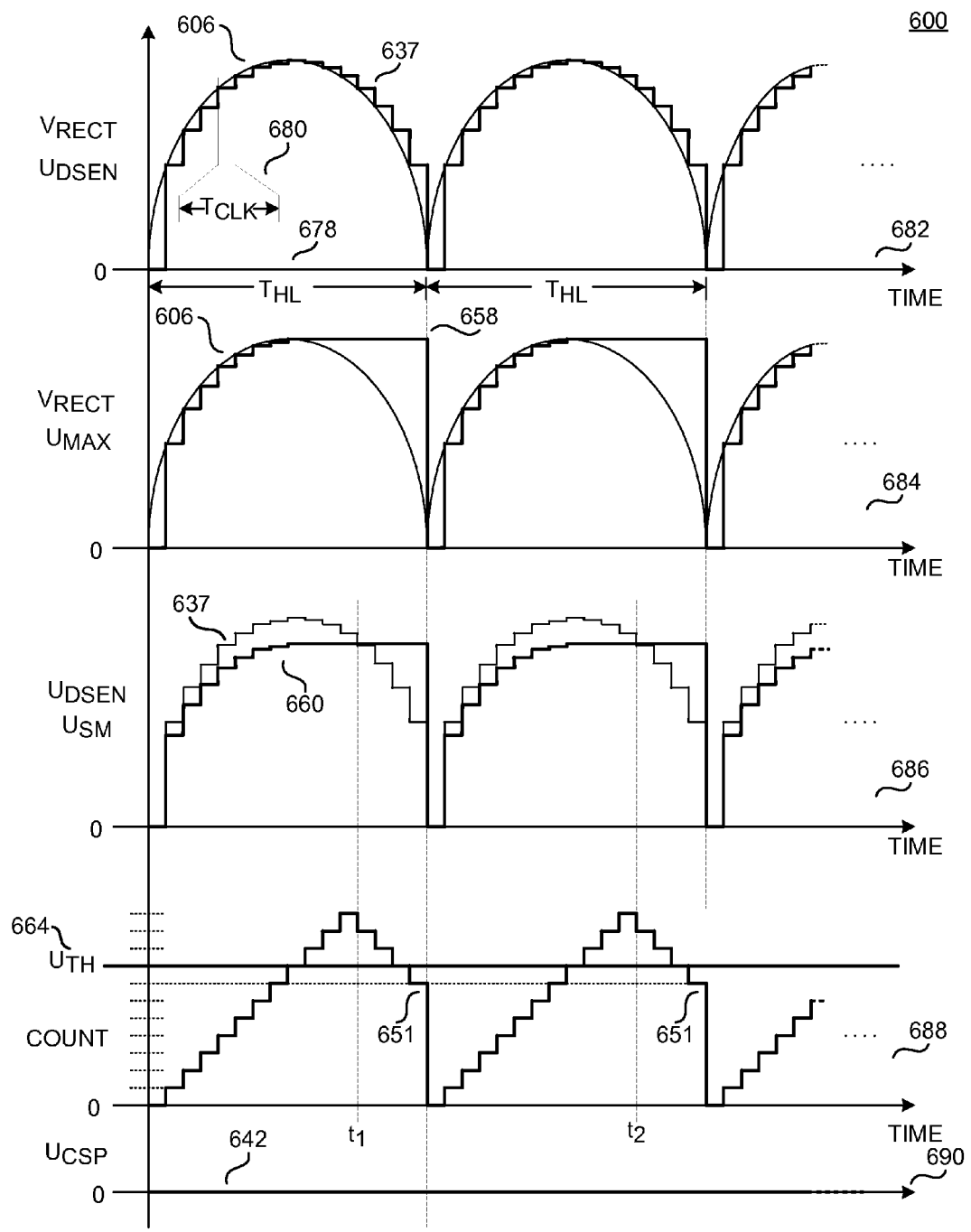
FIG. 6 is a timing diagram illustrating example signals of FIGS. 5A and 5B, in accordance with the teachings of the present invention.

Referring to the example depicted in FIG. 6, a timing diagram 600 illustrates example signals of the waveform shape discriminator in FIGS. 5A and 5B is shown. It should be appreciated that similarly named and numbered elements referenced below are coupled and function as described above. As mentioned above, the waveform shape discriminator may differentiate between a first and second shape. In one example, the first shape may be a sine wave while the second shape may be a square wave. FIG. 6 illustrates example signals of the waveform shape discriminator when the ac input voltage $V_{AC}$ is substantially sinusoidal.

Graph 682 illustrates one example of the rectified voltage $V_{RECT}$ 606 and the digital line sense signal $U_{DSEN}$ 637. As illustrated, the shape of the rectified voltage $V_{RECT}$ 606 is substantially a rectified sinusoid and is shown as the thinner solid line. In one example, the time between zero-crossings (the point which the rectified voltage $V_{RECT}$ 606 is substantially equal to zero) is referred to as the half line cycle $T_{HL}$ 678. As mentioned above, the search window of the waveform shape discriminator is substantially equal to the half line cycle $T_{HL}$ 678. FIG. 6 also illustrates the digital line sense signal $U_{DSEN}$ 637, which is shown in the thicker solid line. Since the digital line sense signal $U_{DSEN}$ 637 corresponds to the digitized version of the rectified voltage $V_{RECT}$ 606, the digital line sense signal $U_{DSEN}$ 637 may include several steps, with each step representing a digital count signal (sample) corresponding to the value of the rectified voltage $V_{RECT}$ 606 at a particular instance in time. The time between steps is substantially equal to the sampling period $T_{CLK}$, which is provided by the sampling clock signal $U_{CLK}$ 539.

Graph 684 illustrates one example of the rectified voltage $V_{RECT}$ 606 (thin solid line) and the maximum signal $U_{MAX}$ 658 (thicker solid line). As mentioned above, the maximum signal $U_{MAX}$ 658 is the current maximum value of the digital line sense signal $U_{DSEN}$ 637 during each search window. As new samples of digital line sense signal $U_{DSEN}$ 637 are obtained, running maximum finder circuit 544 may compare the value represented by maximum signal $U_{MAX}$ 658 with each new sample. If the value of a new sample is greater than the value represented by maximum signal $U_{MAX}$ 658, running maximum finder circuit 544 may update maximum signal $U_{MAX}$ 658 to represent the value of the new, larger sample. If, however, the new sample is not greater than the value represented by maximum signal $U_{MAX}$ 658, running maximum finder circuit 544 may leave maximum signal $U_{MAX}$ 658 unchanged. As illustrated in graph 684, the maximum signal $U_{MAX}$ 658 increments with the digital line sense signal $U_{DSEN}$ 637 until the maximum value of the digital line sense signal $U_{DSEN}$ 637 is reached. The maximum signal $U_{MAX}$ 658 remains at the maximum value for the rest of the half line cycle $T_{HL}$ 678. At the end of the half line cycle $T_{HL}$ 678, the maximum signal $U_{MAX}$ 658 resets to substantially zero.

Graph 686 illustrates both the digital line sense signal $U_{DSEN}$ 637 (thin solid line) and the running maximum threshold signal $U_{SM}$ 660 (thicker solid line) which is a scaled version of the maximum signal $U_{MAX}$ 658. Graph 688 illustrates the internal count of counter 550, resultant output count 651 at the end of the half line cycle $T_{HL}$ 678, and the threshold $U_{TH}$ 664. The digital comparator 548 compares the digital line sense signal $U_{DSEN}$ 637 with the running maximum threshold signal $U_{SM}$ 660. When the digital line sense signal $U_{DSEN}$ 637 is greater than or substantially equal to the running maximum threshold signal $U_{SM}$ 660, the internal count increments, as shown by graph 688. At time $t_1$, the digital line sense signal $U_{DSEN}$ 637 falls below the running maximum threshold signal $U_{SM}$ 660 and the internal count decreases. At the end of the half line cycle $T_{HL}$ 678, the output 651 (which is the last value of the internal count at the end of the half line $T_{HL}$ 678) is compared with the threshold $U_{TH}$ 664. As shown in graph 688, the output 651 is less than the threshold $U_{TH}$ 664. As such the shape signal and the confirmed shape signal $U_{CSP}$ 642 are logic low shown in graph 690. The next half line cycle is substantially the same as the previous half line cycle $T_{HL}$ and the shape signal and the confirmed shape signal $U_{CSP}$ 642 remain logic low.

Figure 7:
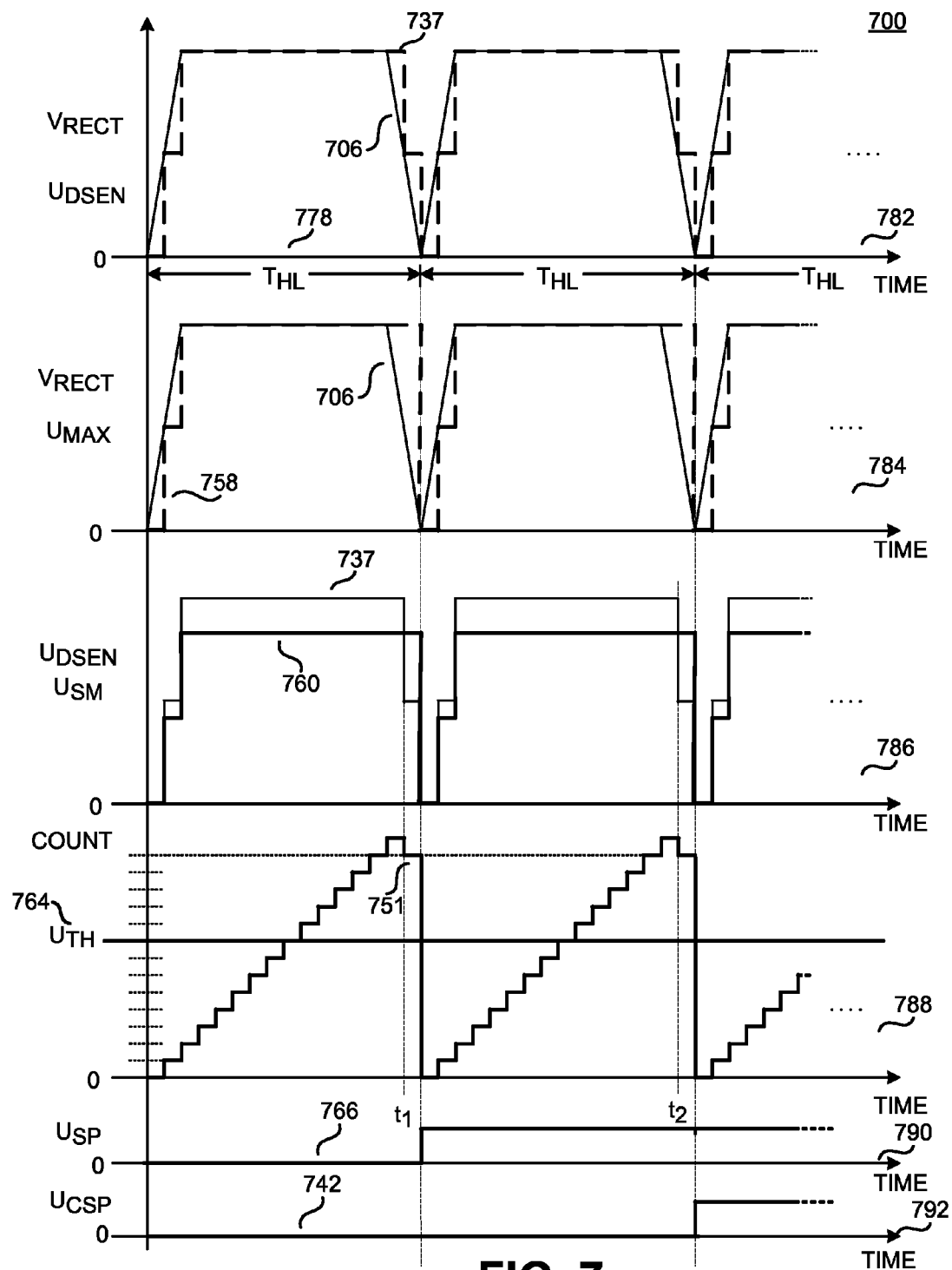
FIG. 7 is another timing diagram illustrating example signals of FIGS. 5A and 5B, in accordance with the teachings of the present invention.

Referring now to the example depicted in FIG. 7 a timing diagram 700, which illustrates example signals of the waveform shape discriminator in FIGS. 5A and 5B is shown. It should be appreciated that similarly named and numbered elements referenced below are coupled and function as described above. As mentioned above, the waveform shape discriminator may differentiate between a first and second shape. In one example, the first shape may be a sine wave while the second shape may be a square wave. FIG. 7 illustrates example signals of the waveform shape discriminator when the ac input voltage $V_{AC}$ is substantially square. For the example shown, the waveform shape discriminator utilizes a persistence checker, which waits for two consecutive cycles to confirm the shape of the input sense signal.

Graph 782 illustrates one example of the rectified voltage $V_{RECT}$ 706 and the digital line sense signal $U_{DSEN}$ 737. As illustrated, the shape of the rectified voltage $V_{RECT}$ 706 is substantially a square wave and is shown as a solid line. In one example, the time between zero-crossings (the point which the rectified voltage $V_{RECT}$ 706 is substantially equal to zero) is referred to as the half line cycle $T_{HL}$ 778. Also illustrated is the digital line sense signal $U_{DSEN}$ 737 shown in a dashed line. Since the digital line sense signal $U_{DSEN}$ 737 corresponds to the digitized version of the rectified voltage $V_{RECT}$ 706, the digital line sense signal $U_{DSEN}$ 737 may include several steps, with each step representing a digital count signal (sample) corresponding to the value of the rectified voltage $V_{RECT}$ 706 at a particular instance in time. The time between steps is substantially equal to the sampling period $T_{CLK}$, which is provided by the sampling clock signal $U_{CLK}$ 539. For the example shown, the digital line sense signal $U_{DSEN}$ 737 takes several steps but then plateaus due to the shape of the rectified voltage $V_{RECT}$ 706.

Graph 784 illustrates one example of the rectified voltage $V_{RECT}$ 706 (solid line) and the maximum signal $U_{MAX}$ 758 (dashed line). As mentioned above, the maximum signal $U_{MAX}$ 758 is the current maximum value of the digital line sense signal $U_{DSEN}$ 737 during each search window. As illustrated in graph 784, the maximum signal $U_{MAX}$ 658 is incremented with the digital line sense signal $U_{DSEN}$ 737 until the maximum value of the digital line sense signal $U_{DSEN}$ 737 is reached. The maximum signal $U_{MAX}$ 758 remains at the maximum value for the rest of the half line cycle $T_{HL}$ 778. At the end of the half line cycle $T_{HL}$ 778, the maximum signal $U_{MAX}$ 758 is reset to substantially zero. Due to the square nature of the rectified voltage $V_{RECT}$ 737, the maximum signal $U_{MAX}$ 758 reaches the maximum value quicker than if the rectified voltage $V_{RECT}$ was a sinusoid (as shown in FIG. 6).

Graph 786 illustrates both the digital line sense signal $U_{DSEN}$ 737 (thin solid line) and the running maximum threshold signal $U_{SM}$ 760 (thicker solid line) which is a scaled version of the maximum signal $U_{MAX}$ 758. Graph 788 illustrates the internal count of counter 750, resultant output count 751 at the end of the half line cycle $T_{HL}$ 778, and the threshold $U_{TH}$ 764. The digital comparator 548 compares the digital line sense signal $U_{DSEN}$ 737 with the running maximum threshold signal $U_{SM}$ 760. When the digital line sense signal $U_{DSEN}$ 737 is greater than or substantially equal to the running maximum threshold signal $U_{SM}$ 760, the internal count increments, as shown by graph 788. At time $t_1$, the digital line sense signal $U_{DSEN}$ 737 falls below the running maximum threshold signal $U_{SM}$ 760 and the internal count decreases. Compared to the internal count shown in FIG. 6, the point at which the digital line sense signal $U_{DSEN}$ 737 falls below the running maximum threshold signal $U_{SM}$ 760 occurs later in the half line cycle $T_{HL}$ 778. At the end of the half line cycle $T_{HL}$ 778, the output 751 (which is the last value of the internal count at the end of the half line $T_{HL}$ 778) is compared with the threshold $U_{TH}$ 764. As shown in graph 788, the output 751 is greater than the threshold $U_{TH}$ 764. As such the shape signal $U_{SP}$ 766 transitions to a logic high value (graph 790). However, the confirmed shape signal $U_{CSP}$ 742 (graph 792) remains at a logic low value. However, the following half line cycle between time $t_1$ and $t_2$ is substantially the same as the previous half line cycle, and thus the confirmed shape signal $U_{CSP}$ 742 transitions to a logic high value since the shape signal $U_{CSP}$ 742 (graph 792) is logic high for two consecutive half line cycles.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:
1. A waveform shape discriminator, comprising
   a running maximum finder circuit coupled to receive an input sense signal that is representative of an input of a power converter, wherein the running maximum finder circuit is further coupled to receive a zero crossing signal, wherein the running maximum finder circuit is coupled to update a running maximum signal in response to the input sense signal and the zero crossing signal;
   a scaling circuit coupled to receive the running maximum signal from the running maximum finder circuit to generate a running maximum threshold signal in response to the running maximum signal, wherein the running maximum threshold signal is a scaled representation of the running maximum signal;
a first comparator coupled to receive the input sense signal and the running maximum threshold signal that is representative of the running maximum signal;
a search window block coupled to receive the input sense signal to detect a search window in the input sense signal, wherein the search window block comprises a zero crossing detector coupled to output the zero crossing signal, wherein the running maximum finder circuit is coupled to output the running maximum signal representative of a maximum value of the input sense signal in the search window as defined by the zero crossing signal; and
an output circuit coupled to output a shape signal in a presence of a waveform shape of the input sense signal, wherein the shape signal has N number of values, and each of the values corresponds to a shape.

2. The waveform shape discriminator of claim 1 wherein the zero crossing detector is coupled to receive the input sense signal, wherein the search window is coupled to begin in response to a zero crossing in the input sense signal.

3. The waveform shape discriminator of claim 1 wherein the output circuit comprises:
a counter coupled an output of the first comparator and an output of the search window block; and
a second comparator coupled to compare an output of the counter with a second threshold to generate a shape signal representative of the waveform shape in the input sense signal within the search window in the input sense signal.

4. The waveform shape discriminator of claim 3 wherein the first comparator is coupled to increment the counter in response to the input sense signal and the running maximum threshold signal.

5. The waveform shape discriminator of claim 3 wherein the first comparator is coupled to decrement the counter in response to the input sense signal and the running maximum threshold signal.

6. The waveform shape discriminator of claim 3 wherein the search window block is coupled to reset the counter in response to a detection of the search window in the input sense signal.

7. The waveform shape generator of claim 3 wherein the shape signal is representative of a first shape when the output of the counter is less than the second threshold, and wherein the shape signal is representative of a second shape when the output of the counter is greater than the second threshold.

8. The waveform shape discriminator of claim 3 wherein the output circuit further includes a persistence checker coupled to receive the shape signal from the second comparator to generate a confirmed shape signal in response to a plurality of consecutive active shape signals received from the second comparator.

9. The waveform shape discriminator of claim 1 wherein the output circuit comprises:
a timer coupled an output of the first comparator and an output of the search window block; and
a second comparator coupled to compare an output of the timer with a second threshold to generate a shape signal representative of the waveform shape in the input sense signal within the search window in the input sense signal.

10. The waveform shape discriminator of claim 9 wherein the first comparator is coupled to enable the timer in response to the input sense signal and the running maximum threshold signal.

11. The waveform shape discriminator of claim 9 wherein the first comparator is coupled to disable the timer in response to the input sense signal and the running maximum threshold signal.

12. The waveform shape discriminator of claim 9 wherein the search window block is coupled to reset the timer in response to a detection of the search window in the input sense signal.

13. The waveform shape generator of claim 9 wherein the shape signal is representative of a first shape when the output of the timer is less than the second threshold, and wherein the shape signal is representative of a second shape when the output of the timer is greater than the second threshold.

14. The waveform shape discriminator of claim 9 wherein the output circuit further comprises a persistence checker coupled to receive the shape signal from the second comparator to generate a confirmed shape signal in response to a plurality of consecutive active shape signals received from the second comparator.

15. A method for discriminating a waveform shape, comprising:
receiving an input sense signal and a zero crossing signal with a running maximum finder circuit, wherein the input sense signal is representative of an input of a power converter;
detecting a search window in the input sense signal as defined by the zero crossing signal;
updating a running maximum signal representative of a maximum value of the input sense signal in the search window as defined by the zero crossing signal in response to the input sense signal;
scaling the running maximum signal with a scaling circuit coupled to receive the running maximum signal from the running maximum finder circuit to generate a running maximum threshold signal in response to the running maximum signal, wherein the running maximum threshold signal is a scaled representation of the running maximum signal;
repeating until an end of a search window:
comparing the input sense signal with the running maximum threshold signal that is representative of the running maximum signal; and
incrementing a counter if the input sense signal is greater than the running maximum threshold signal within the search window as defined by the zero crossing signal;
comparing at the end of the search window a value of the counter with a second threshold; and
generating a shape signal in a presence of the waveform shape of the input sense signal within the search window in response to said comparing at the end of the search window the value of the counter with the second threshold, wherein the shape signal has N number values, and each of the values corresponds to a shape.

16. The method of claim 15 further comprising decrementing the counter if the input sense signal is less than the running maximum threshold signal after said comparing the input sense signal with a running maximum threshold signal and before the end of the search window as defined by the zero crossing signal.

17. The method of claim 15 further comprising resetting the counter in response to detecting the search window in the input sense signal.

18. The method of claim 15 wherein detecting the search window in the input sense signal comprises detecting a zero crossing in the input sense signal.

19. The method of claim 15 wherein the counter is a timer such that said incrementing the counter if the input sense signal is greater than the running maximum threshold signal comprises enabling the timer.

20. The method of claim 15 wherein the counter is a timer, wherein the method further comprises disabling the timer if the input sense signal is less than the running maximum threshold signal after said comparing the input sense signal with a running maximum threshold signal and before the end of the search window.

21. The method of claim 15 further comprising confirming the shape signal in response to in response to a plurality of consecutive active shape signals.

22. A power converter, comprising:
an energy transfer element coupled to a power converter input through a power switch and coupled to a power converter output;
a sense circuit coupled to the power converter output to generate a feedback signal representative of the power converter output; and
a controller including a drive circuit coupled to control switching of the power switch in response to the feedback signal to control a transfer of energy from the power converter input to the power converter output, the controller including a waveform shape discriminator coupled to receive an input sense signal representative of the power converter input to generate a shape signal coupled to be received by the drive circuit, wherein the waveform shape discriminator includes:
a running maximum finder circuit coupled to receive the input sense signal and a zero crossing signal, wherein the running maximum finder circuit is coupled to update a running maximum signal in response to the input sense signal and the zero crossing signal;
a scaling circuit coupled to receive the running maximum signal from the running maximum finder circuit to generate a running maximum threshold signal in response to the running maximum signal, wherein the running maximum threshold signal is a scaled representation of the running maximum signal;
a first comparator coupled to receive the input sense signal and the running maximum threshold signal that is representative of the running maximum signal;
a search window block coupled to receive the input sense signal to detect a search window in the input sense signal, wherein the search window block comprises a zero crossing detector coupled to output the zero crossing signal, wherein the running maximum finder circuit is coupled to output the running maximum signal representative of a maximum value of the input sense signal in the search window as defined by the zero crossing signal; and
a output circuit coupled to output a shape signal in a presence of a waveform shape of the input sense signal, wherein the shape signal has N number of values, and each of the values corresponds to a shape.

23. The power converter of claim 22 further comprising a rectifier coupled to the power converter input.

24. The power converter of claim 22 wherein the zero crossing detector is coupled to receive the input sense signal, wherein the search window is coupled to begin in response to a zero crossing in the input sense signal.

25. The power converter of claim 22 wherein the output circuit comprises:
a counter coupled an output of the first comparator and an output of the search window block; and
a second comparator coupled to compare an output of the counter with a second threshold to generate a shape signal representative of the waveform shape in the input sense signal within the search window in the input sense signal.

26. The power converter of claim 25 wherein the first comparator is coupled to increment the counter in response to the input sense signal and the running maximum threshold signal.

27. The power converter of claim 25 wherein the first comparator is coupled to decrement the counter in response to the input sense signal and the running maximum threshold signal.

28. The power converter of claim 25 wherein the search window block is coupled to reset the counter in response to a detection of the search window in the input sense signal.

29. The power converter of claim 25 wherein the shape signal is representative of a first shape when the output of the counter is less than the second threshold, and wherein the shape signal is representative of a second shape when the output of the counter is greater than the second threshold.

30. The power converter of claim 25 wherein the output circuit further comprises a persistence checker coupled to receive the shape signal from the second comparator to generate a confirmed shape signal in response to a plurality of consecutive active shape signals received from the second comparator.

* * * * *